United States Patent
Meng et al.

(10) Patent No.: US 7,679,262 B2
(45) Date of Patent: Mar. 16, 2010

(54) PIEZOELECTRIC MICRO-PUMP AND DRIVING CIRCUIT THEREOF

(75) Inventors: Hsien-Kai Meng, Taoyuan Hsien (TW);
Shu-Pin Hsien, Taoyuan Hsien (TW);
Chien-Hua Lin, Taoyuan Hsien (TW);
Yu-Chung Hsu, Taoyuan Hsien (TW);
Tai-Hsuan Lin, Taoyuan Hsien (TW)

(73) Assignee: MicroBase Technology Corp., Taoyuan Hsien (TW)

( * ) Notice: Subject to any disclaimer, the term of this patent is extended or adjusted under 35 U.S.C. 154(b) by 133 days.

(21) Appl. No.: 12/115,755

(22) Filed: May 6, 2008

(65) Prior Publication Data

US 2009/0015097 A1    Jan. 15, 2009

(30) Foreign Application Priority Data

Jul. 9, 2007    (TW) ................ 96124883 A (51) Int. Cl.
*H01L 41/04*    (2006.01)
(52) U.S. Cl. .................. 310/317; 310/316.01; 310/314
(58) Field of Classification Search ............ 310/314, 310/316, 317; 417/413.2
See application file for complete search history.

(56) References Cited

U.S. PATENT DOCUMENTS

| | | | | |
|---|---|---|---|---|
| 4,499,878 A | * | 2/1985 | Igashira et al. | 123/478 |
| 6,106,092 A | * | 8/2000 | Norigoe et al. | 347/11 |
| 6,422,836 B1 | * | 7/2002 | Krueger et al. | 417/418 |
| 6,995,496 B1 | * | 2/2006 | Hagood et al. | 310/317 |
| 7,275,522 B2 | * | 10/2007 | Beilharz et al. | 123/490 |
| 7,564,164 B2 | * | 7/2009 | Yamamoto et al. | 310/317 |
| 2009/0206699 A1 | * | 8/2009 | Osano | 310/317 |

FOREIGN PATENT DOCUMENTS

| | | | | |
|---|---|---|---|---|
| JP | 60065969 A | * | 4/1985 | |
| JP | 01138327 A | * | 5/1989 | |
| JP | 02277969 A | * | 11/1990 | |
| JP | 2008206270 A | * | 9/2008 | |

* cited by examiner

*Primary Examiner*—J. SanMartin
(74) *Attorney, Agent, or Firm*—Apex Juris, PLLC; Tracy M. Heims (57) ABSTRACT

The present invention is a driving circuit applied to a piezoelectric activation element, which comprises: a driving period generation unit and a switch circuit unit. The driving period generation unit further comprises: a driving indication signal and a programmable micro-controller, in which the programmable micro-controller is to receive the driving indication signal, and to generate a programmable driving period signal in response to the driving indication signal; and, the switch circuit unit is connected to the driving period generation unit and the piezoelectric activation element, and to receive the driving period signal, and generate an alternate driving voltage in response to the driving period signal; in which, the half-wave leading edge of the alternate driving voltage has the waveform of a parabolic curve waveform, and the half-wave trailing edge of the alternate driving voltage has the waveform of approximately a vertical line waveform, and the alternate driving voltage is connected to the piezoelectric activation element.

16 Claims, 10 Drawing Sheets

PIEZOELECTRIC MICRO-PUMP AND DRIVING CIRCUIT THEREOF

FIELD OF THE INVENTION

The present invention relates to a driving circuit, and particularly applying to a driving circuit of a piezoelectric activation element, and the piezoelectric micro-pump having the driving circuit.

BACKGROUND OF THE INVENTION

Figure 1A:
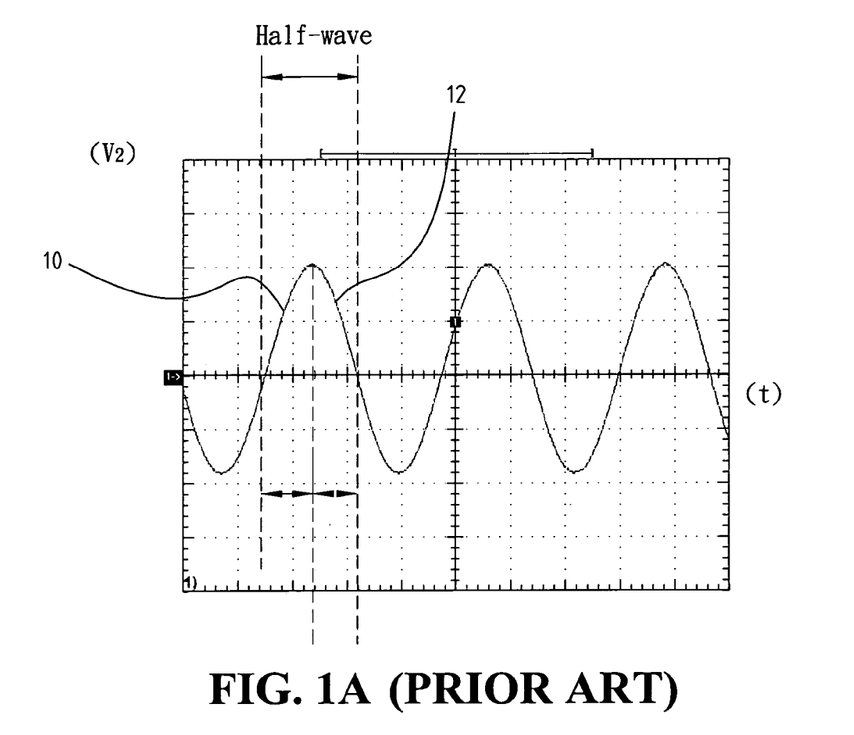
FIG. 1A to 1D are various waveform diagrams of alternate driving voltage V2 for driving the piezoelectric activation element in the prior art.
Figure 1B:
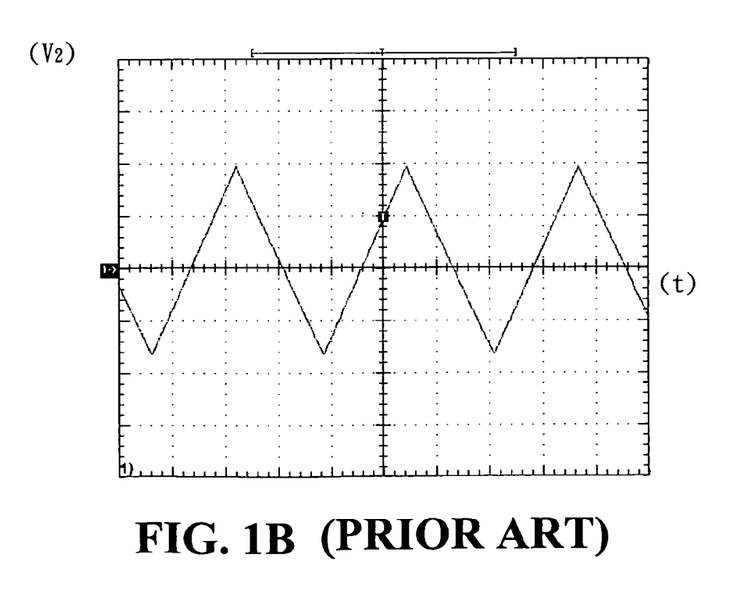
Figure 1C:
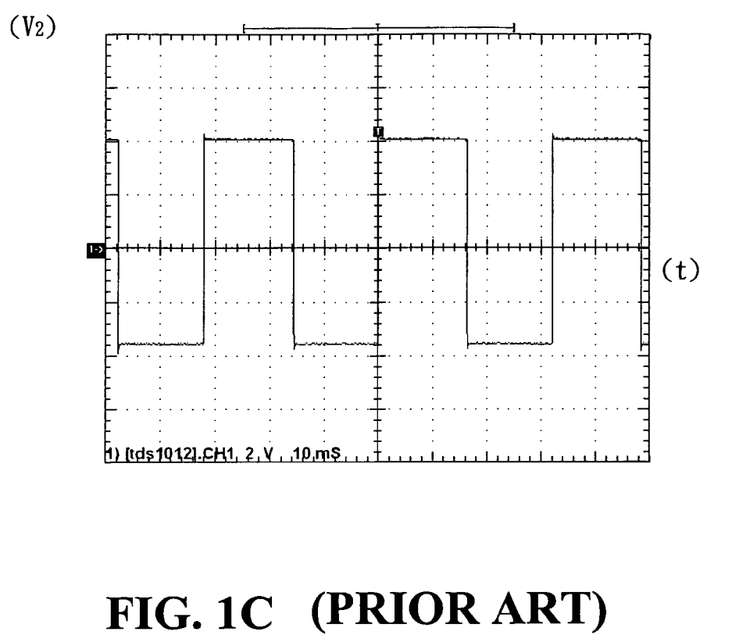
Figure 1D:
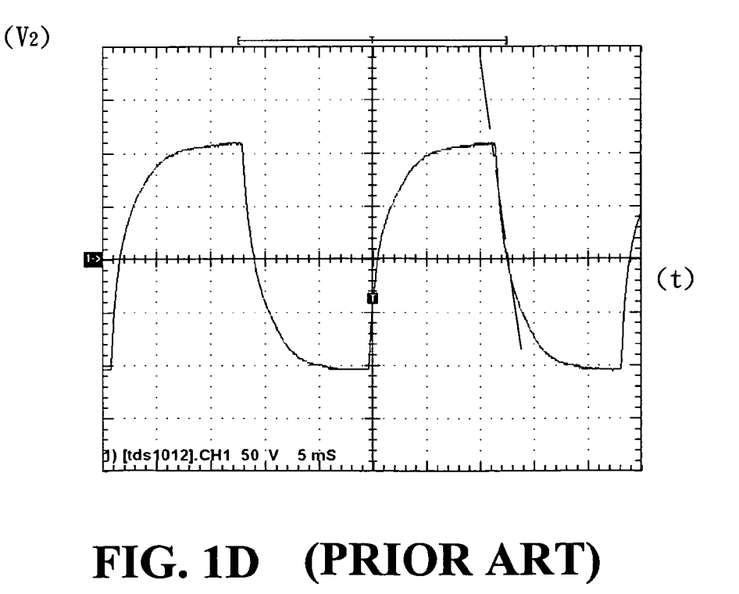
Figure 1E:
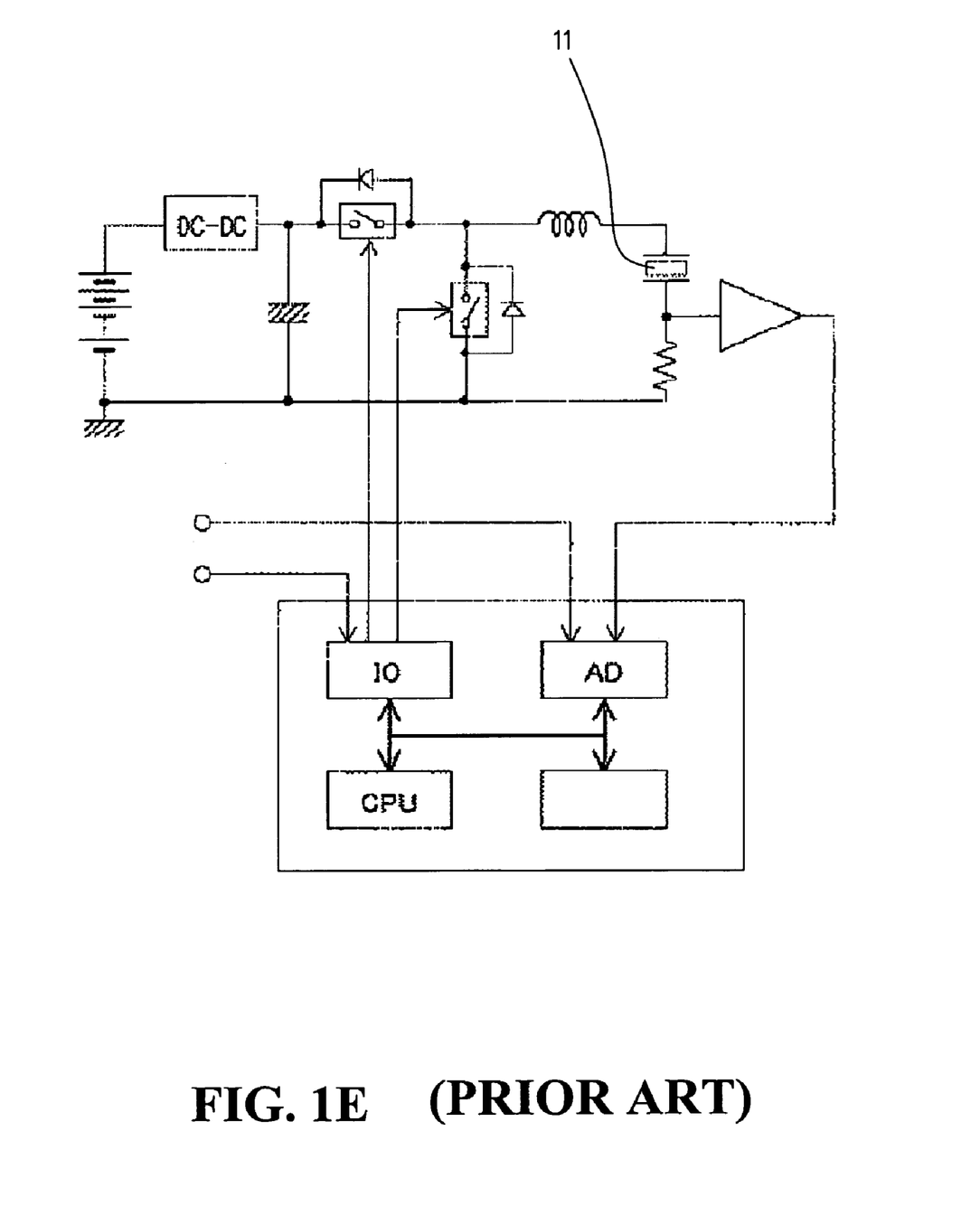
FIG. 1E is a driving circuit of a conventional piezoelectric activation element.
Figure 1F:
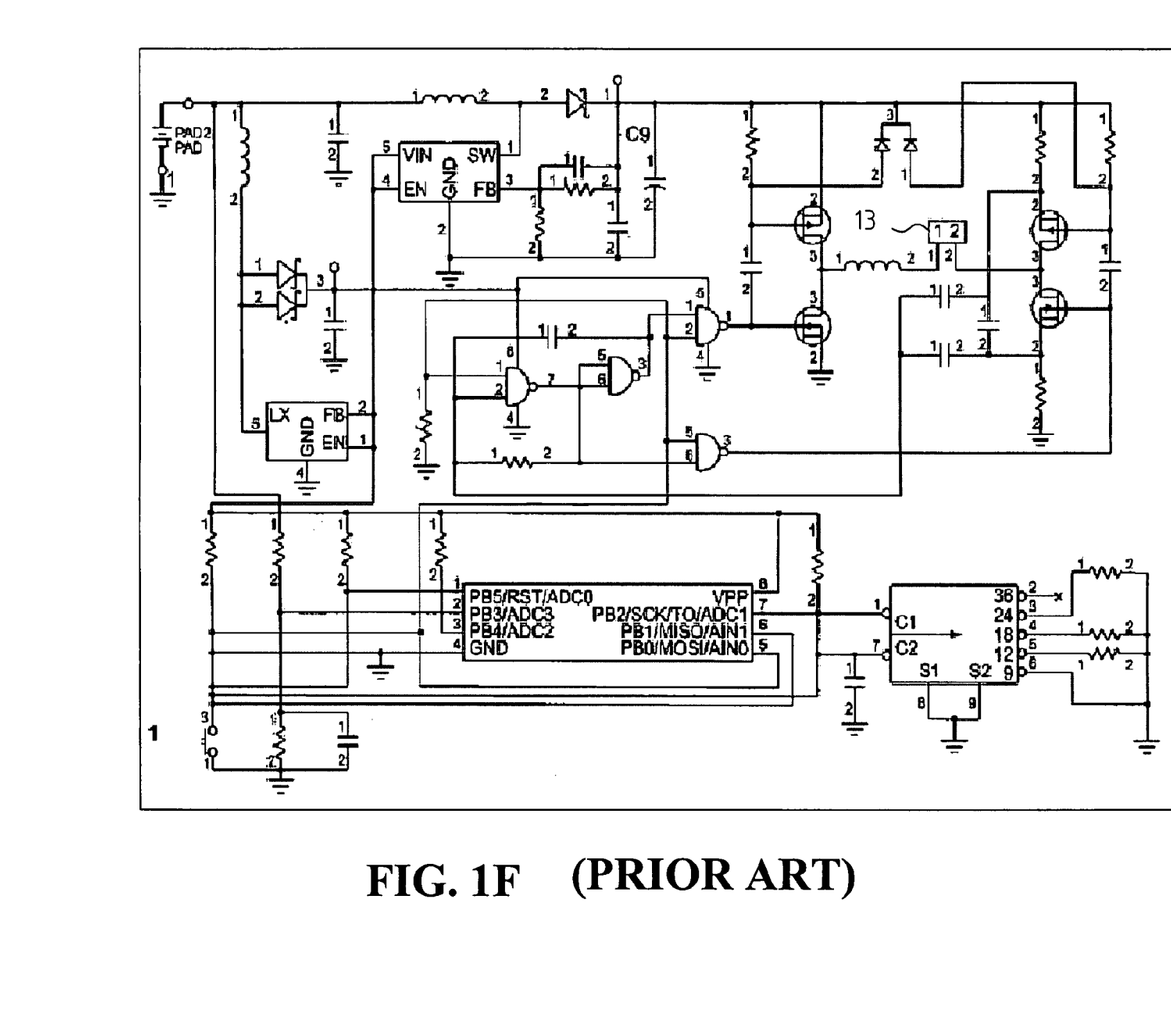
FIG. 1F is a driving circuit of another conventional piezoelectric activation element.

FIG. 1E is a driving circuit of a conventional piezoelectric activation element, which is disclosed in Japan Patent No. JP2004282988A. The driving circuit shown in FIG. 1E could only charge and discharge the single-side electrode of the piezoelectric activation element 11, so the vibration amplitude of the piezoelectric activation element 11 could only reach a half level. FIG. 1F is a driving circuit of another conventional piezoelectric activation element, which is disclosed in US Patent No. US20070046143A1. In FIGS. 1E and 1F, the source of driving signal is generated by the electrodes of the piezoelectric elements 11, 13, which is to make the piezoelectric material being vibrated with its own natural oscillation frequency. However, this kind of driving method would make the driving frequency for the piezoelectric material generated by the circuit could not be arbitrarily changed.

Figure 1G:
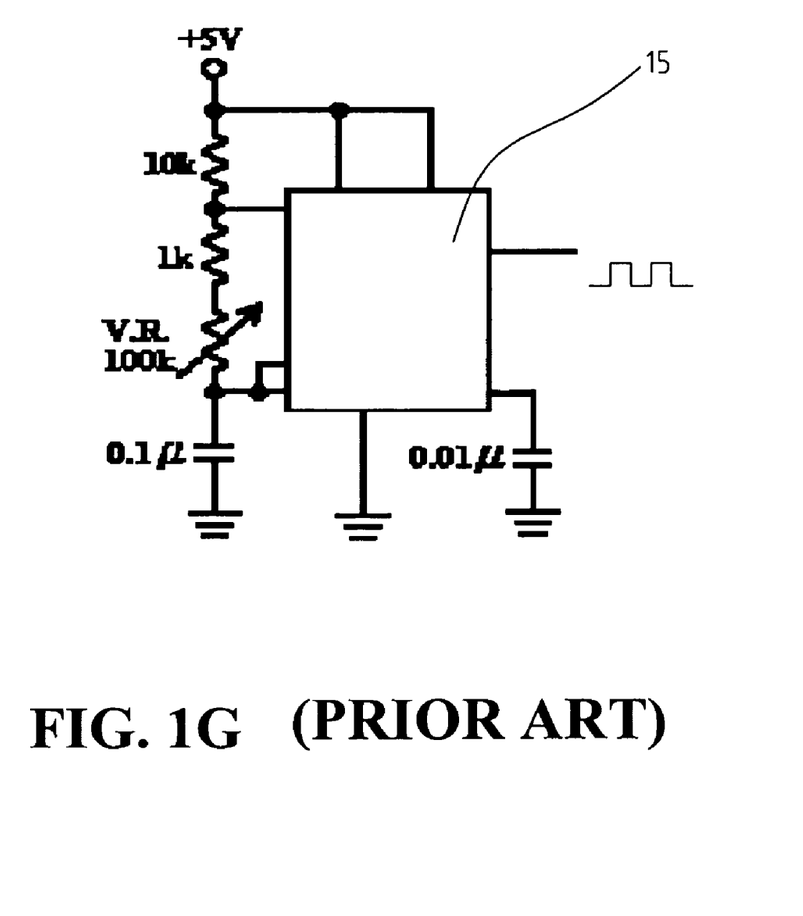
FIG. 1G is a clock frequency generation chip used in a driving circuit of a conventional piezoelectric activation element.

FIG. 1G is a clock frequency generation chip 15 used in a driving circuit of a conventional piezoelectric activation element. The clock frequency generation chip 15 is used as a generation unit for driving period. When the clock frequency generation chip 15 outputs a driving signal with a certain frequency, it has to externally connected with other passive elements, such as resistors and capacitors, except for increasing the circuit layout space, when the resistors or capacitors have the variation of resistance or capacitance due to external conditions, such as temperature, it would seriously affect the precision for the driving signal of the output frequency. Moreover, when the circuit layout is completed, if it is required to change the output frequency of the driving signal, it has to adjust or replace together with the periphery passive elements, so that the flexibility for variation of circuit would be greatly limited, and the piezoelectric activation element could not be applied with intermittent driving function.

FIG. 1A to 1D are various waveform diagrams for the alternate driving voltages V2 driving the piezoelectric activation elements in the prior art, which sequentially are the sine waveform, triangular waveform, square waveform, and quasi-square waveform. In FIG. 1A, we first define the half-wave leading edge 10 as the waveform for charging on the piezoelectric activation element, and the half-wave trailing edge 12 as the waveform for discharging on the piezoelectric activation element, and the half-wave leading edge 10 and the half-wave trailing edge 12 both form a "half wave."

Both the sine wave in FIG. 1A and the triangular wave in FIG. 1B are belonging to the analogy driving waveform. Comparing with the driving wave of square wave in FIG. 1C and quasi-square wave in FIG. 1D, the circuit designs for FIG. 1A and FIG. 1B are more complicated, and required for more layout components, so the required layout space is also larger, which is the defect of the circuit design.

The square wave in FIG. 1C and the quasi-square wave in FIG. 1D are belonging to the digital driving waveform, in which the designed circuits have the advantages of simple layout and rapid discharging. As seen on the half-wave leading edge in FIG. 1C and FIG. 1D, the circuit would proceed rapid charging on the piezoelectric activation element, although the rapid charging would make the piezoelectric driving element fast reaching the peak of the amplitude, and also increase the power consumption. Moreover, because of the rapid charging on the piezoelectric element, after the piezoelectric activation element reached the peak of the amplitude and before the activation of the piezoelectric activation element in opposite direction, the piezoelectric driving element would vibrate in natural oscillation frequency until the piezoelectric activation element is discharged and activated toward the opposite direction. Thus, the natural vibration would also cause the problem of larger noise.

Furthermore, as seen in FIG. 1D, the waveform of the alternate driving voltage is provided with the features of fast charging and slow discharging, except for the more power consumption. The half-wave trailing edge in FIG. 1D is gradually descending in a slope, which indicates that the piezoelectric activation element could not have rapid discharging, so as to delay the time required for entering the next charging and discharging period, and further affect the activation reaction time for the piezoelectric activation element.

SUMMARY OF THE INVENTION

The object of the present invention is to improve the defects in the prior art, and provides a driving circuit to reduce the power consumption, shorten the activation reaction time for piezoelectric activation element, and reduce the noise.

Another object of the present invention is to provide a piezoelectric micro-pump, which provides a driving circuit for controlling the activation frequency of the piezoelectric activator to control the fluid flow.

To this end, the present invention provides a driving circuit applied for a piezoelectric activation element, which comprises: a driving period generation unit, including a driving indication signal; a programmable micro-controller, which receives the driving indication signal, and generate a programmable driving period signal corresponding to the driving indication signal in response to the driving indication signal; a switch circuit unit, which is connected to the driving period generation unit and the piezoelectric activation element, and is to receive the driving period signal to generate an alternate driving voltage corresponding to the driving period signal; wherein, the half-wave leading edge of the alternate driving voltage has the waveform of a parabolic curve waveform, and the half-wave trailing edge of the alternate driving voltage has the waveform of a vertical line waveform, and the alternate driving voltage is connected to the piezoelectric activation element.

Furthermore, the present invention provides a piezoelectric micro-pump for conveying a fluid, which comprises: a case, including an inner chamber, an inlet and an outlet; a piezoelectric activation element, which is configured in the inner chamber for compressing the space of the inner chamber; and, a driving circuit, which is used to drive the piezoelectric activation element, and comprises a driving period generation unit, which includes a driving indication signal; a programmable micro-controller for receiving the driving indication signal, and generate a programmable driving period signal corresponding to the driving indication signal in response to the driving indication signal; a switch circuit unit, which is connected to the driving period generation unit and the piezoelectric activation element, and receives the driving period signal for generating an alternate driving voltage corresponding to the driving period signal; in which, the half-wave leading edge of the alternate driving voltage has the waveform of a parabolic curve waveform, and the half-wave trailing edge of the alternate driving voltage has the waveform of a vertical line waveform, and the alternate driving voltage is connected to the piezoelectric activation element.

BRIEF DESCRIPTION OF THE DRAWINGS

The purpose and the effects of the present invention may be best understood by those skilled in the art by referring to the following detailed description of the preferred embodiments and the accompanying drawings, wherein.

DETAILED DESCRIPTION OF THE INVENTION

Figure 2A:
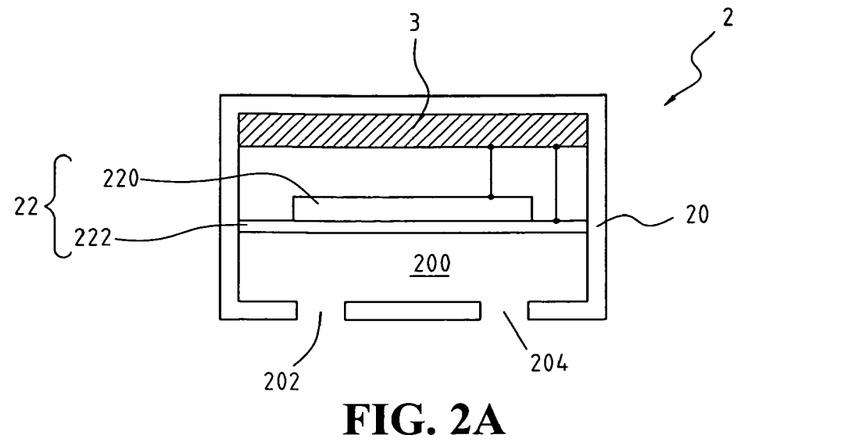
FIG. 2A is a cross-sectional view of a piezoelectric micro-pump having a driving circuit according to the present invention.
Figure 2B:
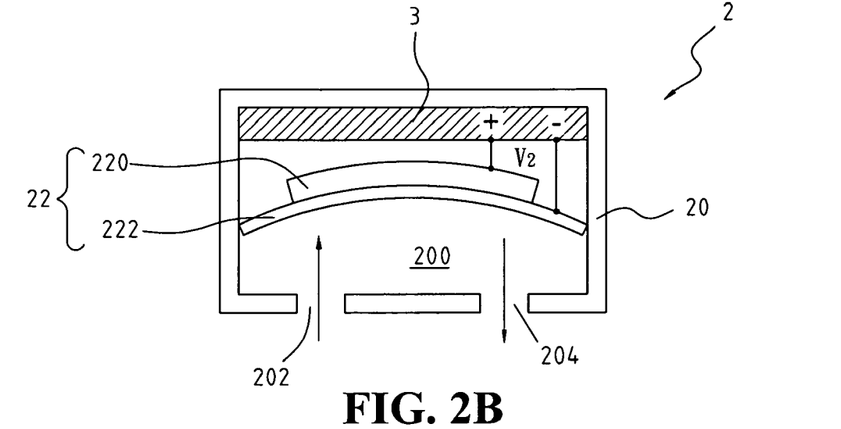
FIG. 2B is a cross-sectional view of a piezoelectric micro-pump in FIG. 2A under a deformed condition.
Figure 2C:
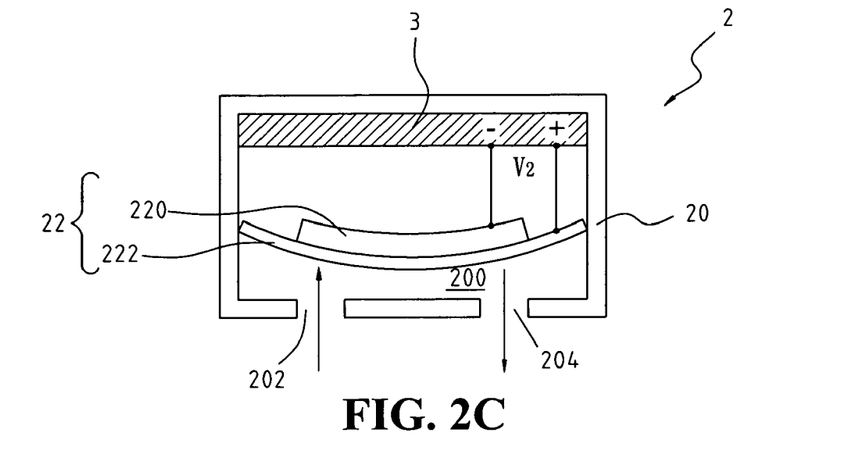
FIG. 2C is a cross-sectional view of a piezoelectric micro-pump in FIG. 2A under another deformed condition.

FIG. 2A is a cross-sectional view of a piezoelectric micro-pump having a driving circuit according to the present invention. The piezoelectric micro-pump 2 could be used to convey a fluid, in which the fluid includes all the liquid and the gas. For example, the liquid includes: diesel, gasoline, methanol, alcohol, purified water, methanol aqueous solution, sea water and the like, and the gas includes: gas, hydrogen, pure oxygen, air, carbon dioxide and the like. As shown in FIG. 2A, the piezoelectric micro-pump 2 comprises: a case 20, a piezoelectric activation element 22, and a driving circuit 3. First, the case 20 is provided with an inner chamber 200, an inlet 202 and an outlet 204. In practical, the piezoelectric micro-pump 2 will usually be configured with a valve element (not shown) at the inlet 202 and the outlet 204. The piezoelectric activation element 22 is configured in the inner chamber 200, and is used to compress the space of the inner chamber 200. As shown in FIG. 2A, the piezoelectric activation element 22 at least comprises: a piezoelectric sheet 220, and the piezoelectric sheet 220 is a sheet made of piezoelectric material. Moreover, the piezoelectric activation element 22 further comprises: a metal film 222, and the metal film 222 is tightly attached on a surface of the piezoelectric sheet 220, and the material could be selected one from Ni, NiCo alloy, stainless steel, Ti, Cu, and brass. Moreover, the driving circuit 3 is used to drive the piezoelectric activation element 22, and the driving circuit 3 is exhibited as an aspect of a circuit board, and the driving method could be referred to FIGS. 2B and 2C. FIG. 2B is a cross-sectional diagram of a piezoelectric micro-pump 2 in FIG. 2A under a deformed condition, and FIG. 2C is a cross-sectional view of a piezoelectric micro-pump 2 in FIG. 2A under another deformed condition. By externally applying the alternate driving voltage V2 generated by the driving circuit 3 on both sides of the piezoelectric activation element 22, the piezoelectric activation element 22 could have the deformation effect along the direction of electric field, so as to transform the electric energy into mechanical energy, and form the operation as in FIGS. 2B and 2C for the in and out of the fluid to and from the inner chamber 200 of the piezoelectric micro-pump 2. Thus, it could achieve the object of conveying fluid by the piezoelectric micro-pump 2.

Figure 3:
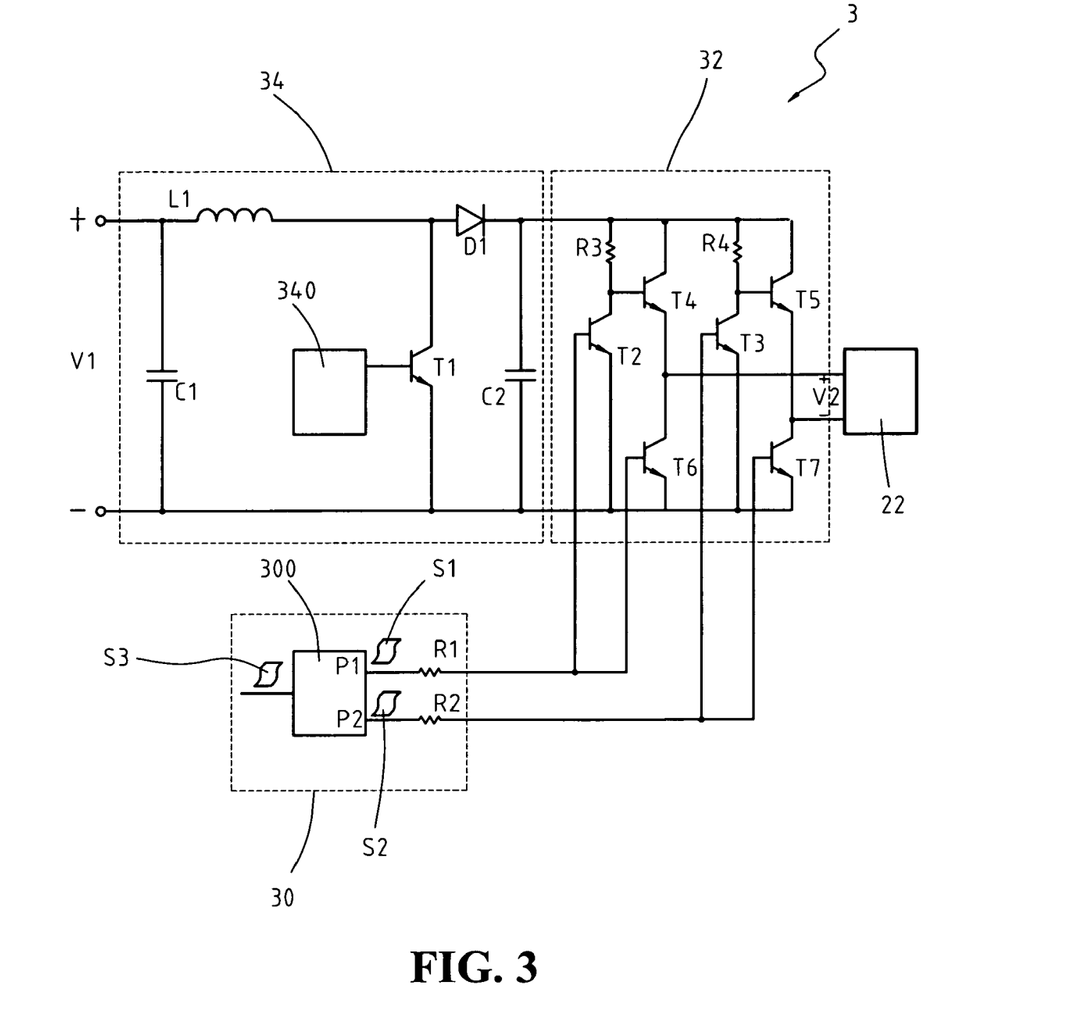
FIG. 3 is a circuit block diagram of the driving circuit according to the present invention.

FIG. 3 is a circuit block diagram of a driving circuit according to the present invention. The driving circuit 3 according to the present invention could be applied to the piezoelectric activation element 22 shown in FIG. 2A. Referring to FIG. 3, the driving circuit 3 comprises: a driving period generation unit 30 and a switch circuit unit 32; wherein the driving period generation unit 30 includes: a driving indication signal S3 and a programmable micro-controller 300; in which, the driving indication signal S3 could be realized by inputting a power signal, or a pulse wave, or a square wave, and the like; and, the programmable micro-controller 300 receives the driving indication signal S3, and generates a programmable driving period signal S1, S2 corresponding to the driving indication signal S3 in response to the driving indication signal S3. The driving period signal S1, S2 generated by the programmable micro-controller 300 could be designed as the signals with the same frequency but in the opposite direction. The examples of various waveforms regarding to the driving period signals S1, S2 would be detailed described in FIG. 4A to 4D. In FIG. 3, the driving period generation unit 30 further comprises a first limited current resistor R1 and a second limited current resistor R2; wherein, one end of the first limited current resistor R1 is connected to the output P1 of the programmable micro-controller 300 generating the driving period signal S1, and the other end of the first limited current resistor R1 is connected to the base of a second bipolar junction transistor T2 and the base of a sixth bipolar junction transistor T6; and, one end of the second limited current resistor R2 is connected to the output P2 of the programmable micro-controller 300 generating another driving period signal S2, and the other end of the second limited current resistor R2 is connected to the base of the third bipolar junction transistor T3 and the base of the seventh bipolar junction transistor T7. Moreover, in an embodiment, the first limited current resistor R1 and the second limited current resistor R2 could employ the resistance in a range from 10 kOhm to 20 MOhm.

The switch circuit unit 32 is connected to the driving period generation unit 30 and the piezoelectric activation element 22, and the switch circuit unit 32 receives the driving period signals S1, S2, and generates the alternate driving voltage V2 corresponding to the driving period signals S1, S2. The waveform regarding to the alternate driving voltage V2 would be further described in FIG. 5. Hereinafter, the implementation of the circuit for the switch circuit unit 32 would be described. Referring to FIG. 3, the switch circuit unit 32 comprises: a second bipolar junction transistor T2, a third bipolar junction transistor T3, a fourth bipolar junction transistor T4, a fifth bipolar junction transistor T5, a sixth bipolar junction transistor T6, and a seventh bipolar junction transistor T7; wherein, the base of the fourth bipolar junction transistor T4 is connected to the collector of the second bipolar junction transistor T2, and the emitter of the fourth bipolar junction transistor T4 is connected to an input of the piezoelectric activation element 22; furthermore, the base of the fifth bipolar junction transistor T5 is connected to the collector of the third bipolar junction transistor T3, and the collector of the fifth bipolar junction transistor T5 is connected to the collector of the fourth bipolar junction transistor T4, and the emitter of the fifth bipolar junction transistor T5 is connected to another input of the piezoelectric activation element 22; the emitter of the sixth bipolar junction transistor T6 is connected to the emitter of the second bipolar junction transistor T2, and the collector of the sixth bipolar junction transistor T6 is connected to the emitter of the fourth bipolar junction transistor T4; and, the emitter of the seventh bipolar junction transistor T7 is connected to the emitter of the third bipolar junction transistor T3, and the collector of the seventh bipolar junction transistor T7 is connected to the emitter of the fifth bipolar junction transistor T5, and the emitter of the seventh bipolar junction transistor T7 is connected to the emitter of the sixth bipolar junction transistor T6. In FIG. 3, the switch circuit unit 32 further comprises a third limited current resistor R3 and a fourth limited current resistor R4, in which one end of the third limited current resistor R3 is connected to the collector of the fourth bipolar junction transistor T4, and the other end is connected to the base of the fourth bipolar junction transistor T4; and, one end of the fourth limited current resistor R4 is connected to the collector of the fifth bipolar junction transistor T5, and the other end is connected to the base of the fifth bipolar junction transistor T5.

Because the frequencies for the driving period signals S1, S2 received by the switch circuit unit 32 are the same, but as signals in opposite direction, the operation method for the switch circuit unit 32 has two types: first is that the fourth bipolar junction transistor T4 and the seventh bipolar junction transistor T7 would be simultaneously opened, and the fifth bipolar junction transistor T5 and the sixth bipolar junction transistor T6 would be simultaneously closed; second is that the fourth bipolar junction transistor T4 and the seventh bipolar junction transistor T7 would be simultaneously closed, and the fifth bipolar junction transistor T5 and the sixth bipolar junction transistor T6 would be simultaneously opened. The above-mentioned two operation methods are proceeded alternatively, so that the voltage polarity applied on both sides of the piezoelectric activation element 22 would be switched alternatively. The switch circuit unit 32 could conduct the charging or discharging on both sides of the piezoelectric activation element 22, and further employ the vibration amplitude at both sides of the piezoelectric material.

As shown in FIG. 3, the driving circuit 3 further comprises: a ramp-up circuit unit 34; wherein, the ramp-up circuit unit 34 is connected to the switch circuit unit 32, which comprises: an input capacitor C1, a diode D1, a first bipolar junction transistor T1, an inductor L1, a DC ramp-up converter 340, and an output capacitor C2; wherein, one end of the inductor L1 is connected to one end of the input capacitor C1, and the other end of the inductor L1 is connected to the input of the diode D1 and the collector of the first bipolar junction transistor T1; the output of the DC ramp-up converter 340 is connected to the base of the first bipolar junction transistor T1, and with the switch signal inside the DC ramp-up converter 340 to control the ON/OFF of the first bipolar junction transistor T1, so the input voltage V1 could be raised to a predetermined voltage; and, one end of the output capacitor C2 is connected to the output of the diode D1 and the collector of the fourth bipolar junction transistor T4, and the other end of the output capacitor C2 is connected to the emitter of the sixth bipolar junction transistor T6, the emitter of the first bipolar junction transistor T1, and the other end of the input capacitor C1.

Figure 4A:
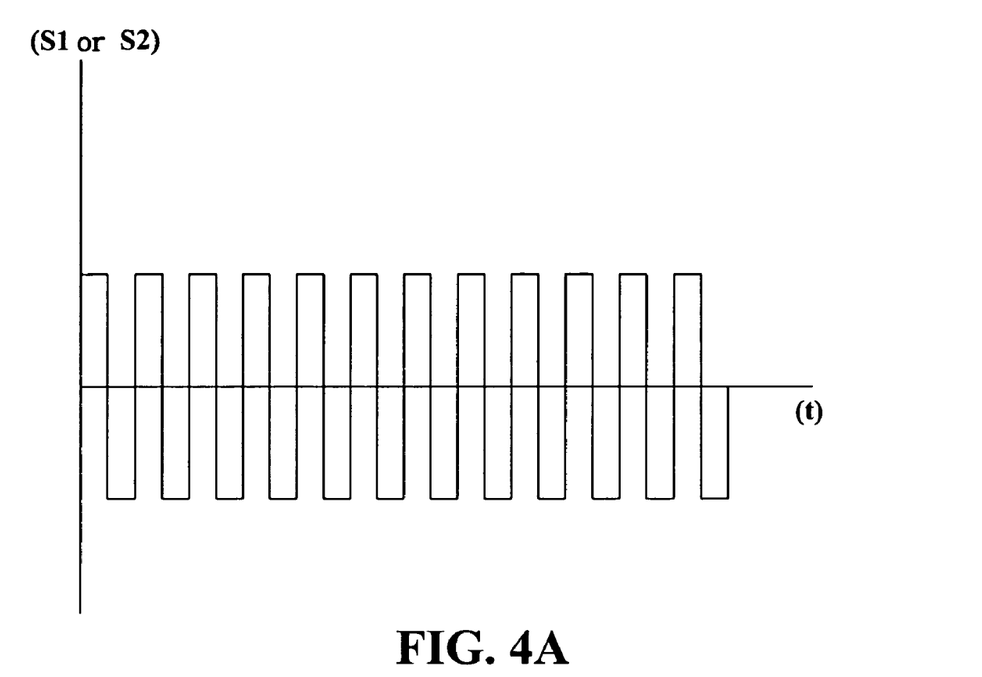
FIG. 4A to 4D are various waveform diagrams exhibiting a driving period signal S1 or a driving period signal S2.
Figure 4B:
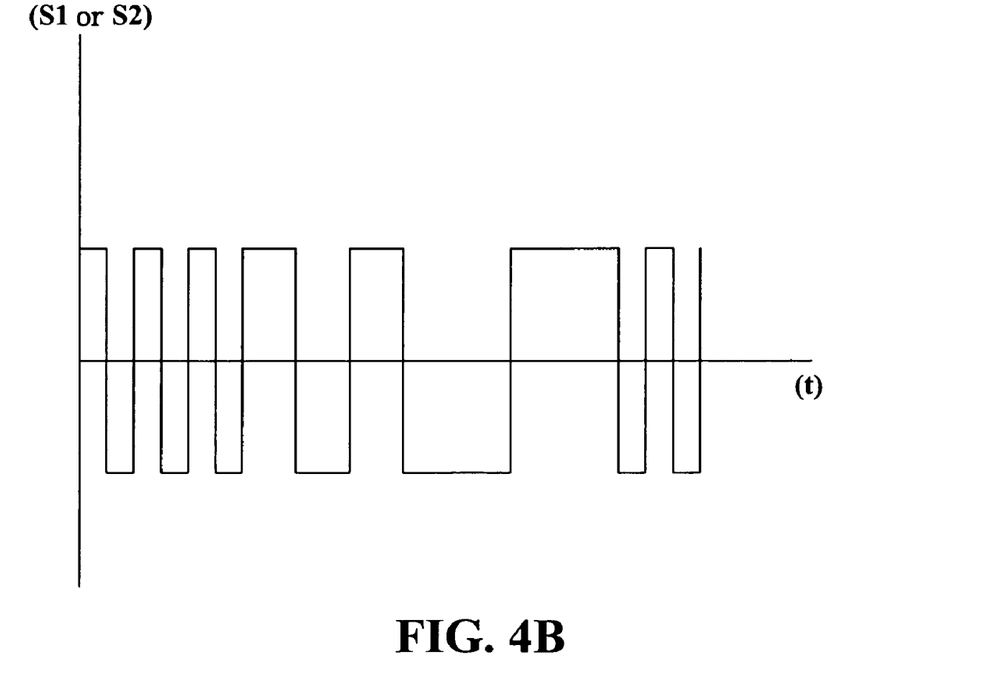
Figure 4C:
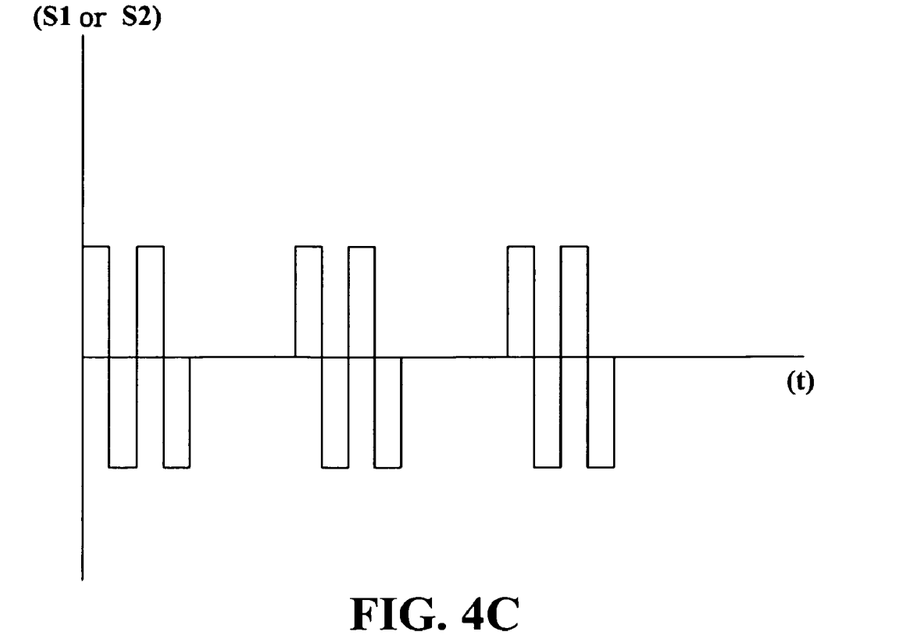
Figure 4D:
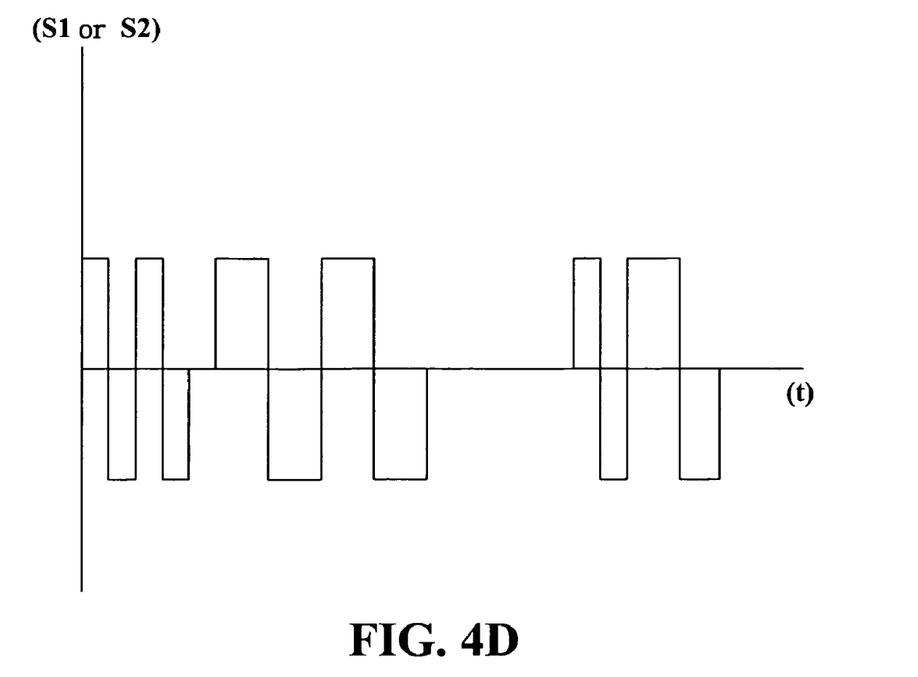

FIG. 4A to 4D are various waveform diagrams exhibiting the driving period signal S1 or the driving period signal S2. The driving period signal S1 or the driving period signal S2 are the common square waves, and the suitable working frequency range for the driving period signals S1, S2 according to the present invention is 1 Hz~500 Hz. As shown in FIG. 4A, the driving period signal S1 or the driving period signal S2 are continuously operating with a fixed frequency. As shown in FIG. 4B, the driving period signal S1 or the driving period signal S2 are continuously operating with different frequencies. As shown in FIG. 4C, the driving period signal S1 or the driving period signal S2 are intermittently operating with a fixed frequency and a fixed time period. As further shown in FIG. 4D, the driving period signal S1 or the driving period signal S2 are intermittently operating with different frequencies and different time periods. As known from FIG. 4A to 4D, one important feature of the driving circuit according to the present invention is that the driving period signals S1, S2 generated by the programmable micro-controller 300 is a programmable signal, that is the exhibited various waveform modes could be used to control the programmable micro-controller 300 by the implementation of writing firmware by the program designer in advance.

Figure 5:
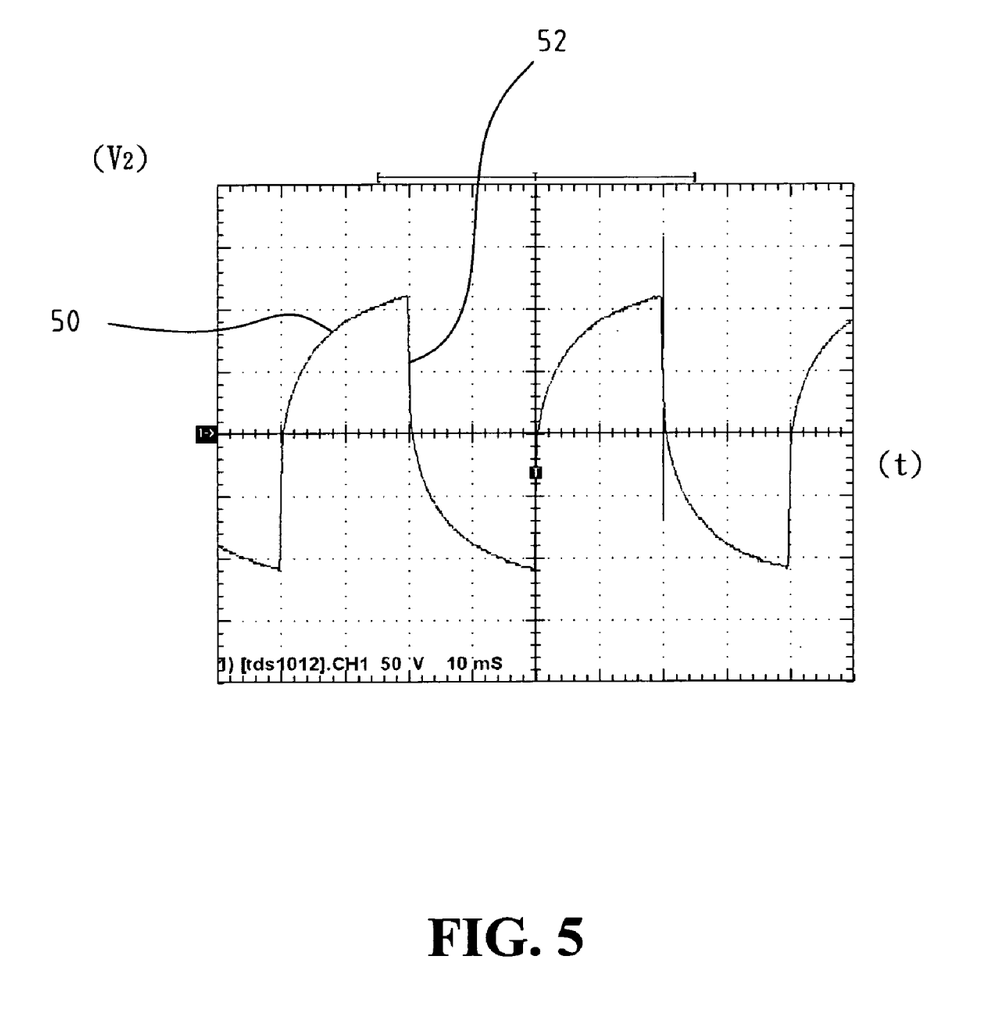
FIG. 5 is a waveform diagram of an alternate driving voltage V2 generated by the driving circuit according to the present invention.

FIG. 5 is a waveform diagram of the alternate driving voltage V2 generated by the driving circuit according to the present invention. As shown in FIG. 5, the half-wave leading edge 50 of the alternate driving voltage V2 has the waveform of a parabolic curve waveform, and the half-wave trailing edge 52 of the alternate driving voltage V2 has the waveform of approximately a vertical line waveform. Because the appearance of the waveform for the alternate driving voltage generated according to the present invention is similar to the dorsal fin of a shark, it could be referred to a fin-type driving waveform, which is another important feature of the driving circuit according to the present invention. Compared with the waveforms of various conventional alternate driving voltage V2 previously described, there are few advantages for the alternate driving voltage V2 according to the present invention: first, the half-wave leading edge 50 of the alternate driving voltage V2 is exhibited in a smooth parabolic curve, and the parabolic curve indicates that the driving circuit according to the present invention could gradually charge the piezoelectric activation element 22 in a more moderate manner, so as to greatly reduce the power consumption caused by rapid charging. Furthermore, by gradually charging the piezoelectric activation element 22 in a more moderate manner could make the piezoelectric activation element 22 rapidly discharge immediately after reaching the peak of the amplitude. Thus, the fin-type driving waveform of the present invention could prevent the piezoelectric activation element 22 from generating unnecessary vibration in its own natural oscillation frequency during the excess time when reaching the peak of the amplitude, so as to greatly reduce the noise problem during the operation of the piezoelectric activator. Secondly, the half-wave trailing edge 52 of the alternate driving voltage V2 has the waveform of approximately a vertical line waveform, which means that the piezoelectric activation element 22 could be rapidly discharged, and rapidly enter the next charge/discharge program, thus to increase the reaction time of the piezoelectric activation element 22.

Finally, the other features and effects of the driving circuit according to the present invention could be further described as follows:

1. The driving circuit according to the present invention is controlled by a digital signal, which could provide higher signal stability, and reduce the complexity of circuit design;

2. The driving circuit according to the present invention employs the programmable micro-controller to replace the clock frequency generation IC in the prior art as the PWM (Pulse-width modulation) controller, which could not only reduce the periphery components to simplify the circuit, but also save a lot of layout spaces; and 3. Because the driving circuit according to the present invention employs a programmable micro-controller, if it is required to change the output operation and frequency of the driving period signal, it is only needed to re-write the internal program, but no need to change the original hardware circuit, which could not only save the cost and time, but also greatly improve the flexibility for design change.

The present invention has been disclosed with the embodiments as above. However, these disclosed embodiments are not used to limit the present invention. The skilled in the art could have various changes and modification to the embodiments without departing from the spirit and scope of the present invention, and the changes and modification should be all covered in the scope of the present invention. The patent protection scope for the present invention should be defined by the attached claims of the application.

What is claimed is:

1. A driving circuit applied for a piezoelectric activation element, which comprises:
    a driving period generation unit, including
        a driving indication signal;
        a programmable micro-controller, which receives the driving indication signal, and generate a programmable driving period signal corresponding to the driving indication signal in response to the driving indication signal;
    a switch circuit unit, which is connected to the driving period generation unit and the piezoelectric activation element, and receives the driving period signal to generate an alternate driving voltage corresponding to the driving period signal, in which the half-wave leading edge of the alternate driving voltage has the waveform of a parabolic curve waveform, and the half-wave trailing edge of the alternate driving voltage has the waveform of approximately a vertical line waveform, and the alternate driving voltage is connected to the piezoelectric activation element.

2. The driving circuit according to claim 1, wherein the switch circuit unit comprises:
    a second bipolar junction transistor;
    a third bipolar junction transistor;
    a fourth bipolar junction transistor, in which the base of the fourth bipolar junction transistor is connected to the collector of the second bipolar junction transistor, and the emitter of the fourth bipolar junction transistor is connected to an input of the piezoelectric activation element;
    a fifth bipolar junction transistor, in which the base of the fifth bipolar junction transistor is connected to the collector of the third bipolar junction transistor, and the collector of the fifth bipolar junction transistor is connected to the collector of the fourth bipolar junction transistor, and the emitter of the fifth bipolar junction transistor is connected to the other input of the piezoelectric activation element;
    a sixth bipolar junction transistor, in which the emitter of the sixth bipolar junction transistor is connected to the emitter of the second bipolar junction transistor, and the collector of the sixth bipolar junction transistor is connected to the emitter of the fourth bipolar junction transistor; and,
    a seventh bipolar junction transistor, in which the emitter of the seventh bipolar junction transistor is connected to the emitter of the third bipolar junction transistor, and the collector of the seventh junction transistor is connected to the emitter of the fifth bipolar junction transistor, and the emitter of the seventh bipolar junction transistor is connected to the emitter of the sixth bipolar junction transistor.

3. The driving circuit according to claim 2, wherein the driving period generation unit further comprises:
    a first limited current resistor, with one end connected to the output of the programmable micro-controller generating a driving period signal, and the other end connected to the base of the second bipolar junction transistor and the base of the sixth bipolar junction transistor;
    a second limited current resistor, with one end connected to the output of the programmable micro-controller generate another driving period signal, and the other end connected to the base of the third bipolar junction transistor, and the base of the seventh bipolar junction transistor.

4. The driving circuit according to claim 3, wherein the first limited current resistor and the second limited current resistor have the resistance range from 10 kOhm~20 MOhm.

5. The driving circuit according to claim 2, further comprises: a ramp-up circuit unit, which is connected to the switch circuit unit, wherein the ramp-up circuit unit comprises:
    an input capacitor;
    a diode;
    a first bipolar junction transistor;
    an inductor, with one end connected to one end of the input capacitor, and the other end connected to the input of the diode and the collector of the first bipolar junction transistor;
    a DC ramp-up converter, with the output connected to the base of the first bipolar junction transistor;
    an output capacitor, with one end connected to the output of the diode and the collector of the fourth bipolar junction transistor; and the other end connected to the emitter of the sixth bipolar junction transistor, the emitter of the first bipolar junction transistor, and the other end of the input capacitor.

6. The driving circuit according to claim 2, wherein the switch circuit unit further comprises:
    a third limited current resistor, with one end connected to the collector of the fourth bipolar junction transistor, and the other end connected to the base of the fourth bipolar junction transistor;
    a fourth limited current resistor, with one end connected to the collector of the fifth bipolar junction transistor, and the other end connected to the base of the fifth bipolar junction transistor.

7. The driving circuit according to claim 1, wherein the driving indication signal is a power signal, a pulse wave, or a square wave.

8. The driving circuit according to claim 1, wherein the driving indication signal is a square wave.

9. The driving circuit according to claim 1, wherein the driving indication signals are continuously operating with a fixed frequency.

10. The driving circuit according to claim 1, wherein the driving indication signals are continuously operating with different frequencies.

11. The driving circuit according to claim 1, wherein the driving indication signals are intermittently operation with a fixed frequency and a fixed time period.

12. The driving circuit according to claim 1, wherein the driving indication signals are intermittently operation with different frequencies and different time periods.

13. The driving circuit according to claim 1, wherein the working frequency range of the driving period signal is from 1 Hz to 500 Hz.

14. A piezoelectric micro-pump for conveying a fluid, which comprises:
- a case, including an inner chamber, and an inlet and an outlet;
- a piezoelectric element, which is configured in the inner chamber for compressing the space of the inner chamber; and,
- a driving circuit for driving the piezoelectric activation element, which includes:
- a driving period generation unit, includes:
- a driving indication signal;
- a programmable micro-controller, which receives the driving indication signal, and generate a programmable driving period signal corresponding to the driving indication signal in response to the driving indication signal;
- a switch circuit unit, which is connected to the driving period generation unit and the piezoelectric activation element, and receives the driving period signal and generates an alternate driving voltage corresponding to the driving period signal, in which the half-wave leading edge of the alternate driving voltage has the waveform of a parabolic curve waveform, and the half-wave trailing edge of the alternate driving voltage has the waveform of approximately a vertical line waveform, and the alternate driving voltage is connected to the piezoelectric activation element.

15. The piezoelectric micro-pump according to claim 14, wherein the piezoelectric activation element at least comprises: a piezoelectric sheet, which is a sheet made of piezoelectric material.

16. The piezoelectric micro-pump according to claim 15, wherein the piezoelectric activation element further comprises: a metal film, which is tightly attached on a surface of the piezoelectric sheet.

* * * * *